US005528388A

United States Patent [19]

Tanaka

[11] Patent Number: 5,528,388

[45] Date of Patent: Jun. 18, 1996

[54] COLOR CORRECTION METHOD BASED ON AVERAGE BRIGHTNESS OF PIXELS GROUPED INTO BRIGHTNESS RANGES

[75] Inventor: Yuji Tanaka, Hokkaido, Japan

[73] Assignee: Hudson Soft Co., Ltd., Japan

[21] Appl. No.: 271,256

[22] Filed: Jul. 7, 1994

Related U.S. Application Data

[63] Continuation of Ser. No. 917,579, Jul. 21, 1992, abandoned.

[30] Foreign Application Priority Data

Feb. 28, 1992 [JP] Japan .................................... 4-078512

[51] Int. Cl.$^6$ ................................ H04N 1/46; G03F 3/00

[52] U.S. Cl. ............................................ 358/520; 358/518

[58] Field of Search ............................ 358/518, 27, 520; 348/223, 655, 673, 687; H04N 1/46

[56] References Cited

U.S. PATENT DOCUMENTS

| | | | |
|---|---|---|---|
| 4,602,277 | 7/1986 | Guichard | 358/27 |
| 4,727,425 | 2/1988 | Mayne et al. | 358/80 |
| 4,847,677 | 7/1989 | Music et al. | 358/13 |
| 5,170,152 | 12/1992 | Taylor | 348/61 |

FOREIGN PATENT DOCUMENTS

| | | | |
|---|---|---|---|
| 0261561 | 3/1988 | European Pat. Off. | H04N 11/02 |

OTHER PUBLICATIONS

European Search Report.

*Primary Examiner*—Safet Metjahic
*Assistant Examiner*—Cheryl Cohen
*Attorney, Agent, or Firm*—Laff, Whitesel, Conte & Saret, Ltd.

[57] ABSTRACT

Each color dot is displayed by three original color components. In each color dot, a brightness is calculated in accordance with brightness constants for the three original color components and three original color component data. In accordance with brightness calculated for dots to be displayed, the dots are grouped by the brightness and ranges for grouping of the dots. Among each grouped dots, data are equalized in each of the three original color component data to be stored in place of the three original color component data obtained by a scanner, a video camera, etc.

6 Claims, 5 Drawing Sheets

COLOR CORRECTION METHOD BASED ON AVERAGE BRIGHTNESS OF PIXELS GROUPED INTO BRIGHTNESS RANGES

This application is a continuation of application Ser. No. 07/917,579, filed Jul. 21, 1992, now abandoned.

FIELD OF THE INVENTION

This invention relates to a method for amending color nonuniformity of color images, and more particularly to, a graphic processing used in a computer image display system, etc.

BACKGROUND OF THE INVENTION

In the processing of a picture in a computer, analog data representing natural pictures are not directly processed, but converted to digital data which are obtained by digitalizing the analog data at sampling points of time. In color images, the digital data are of color data, or the combination of pattern data and color data. Such data processed in a computer are composed of a predetermined number of dots, and an image reproduced by such dots has a high reproducibility, as the number of dots per a unit area is increased. Consequently, a large capacity of a memory apparatus is required in the image processing of a computer to improve the reproducibility, and, thus, a processing time becomes longer.

In the case where image data are generated in accordance with scanning on a natural picture, or taking a picture thereof by using a video camera, etc. the number of dots and colors represented by a computer is practically limited to some extent. This limitation is the resulted of the resolution power of the input apparatus such as a scanner or a video camera on one hand, and a performance such as a memory capacity, a processing speed, etc. of a computer on the other hand.

For the purpose of reproducing a natural picture with high-fidelity, a limitless number of dots are required. However, a resolution power of human eyes is limited on the distinction among dots and colors, so that images which are natural for viewers can be presented on a display.

When images are watched by viewers, an important role is played by not only brightness and darkness, but also colors. For instance, in case where two color papers of red and blue having the same brightness are positioned to make contact with each other along respective one sides, the two color papers which are distinctively displayed by colors are represented to be one paper by monochrome display. As clear from this explanation, whether a natural picture looks natural or not is largely affected by colors.

If the number of colors which can be represented by a computer is less than that of colors which can be discriminated by human eyes, fine difference of brightness and darkness and fine mixed tone of colors can not be represented by the computer. In such a case, color nonuniformity occurs, and a natural picture can not be reproduced with high-fidelity.

on the other hand, if the number of colors which can be represented by a computer is more than that of colors which can be discriminated by human eyes, a natural picture can be represented with high-fidelity. However, even if colors look the same for human eyes, there are a lot of cases in which color data obtained from the same-looking colors are different. This is because the fluctuation of color data occurs. For the reason, the processing of data is difficult, so that raw image data are required to be stored without any processing. As a result, the amount of data becomes large. This applies a pressure on a memory in regard to a capacity thereof, and influence badly on a processing time of data.

Further, if the number of colors which can be represented by a computer is approximately equal to that of colors which can be discriminated by human eyes, no problem occurs basically. Practically, however, color characteristics at the time of representing colors on a display and color characteristics which can be discriminated by human eyes are not coincided. As a result, the same problem as in the above case occurs.

SUMMARY OF THE INVENTION

Accordingly, it is an object of the invention to provide a method for amending color nonuniformity of color images in which the reproducibility of images is not deteriorated.

It is a further object of the invention to provide a method for amending color nonuniformity of color images in which the amount of image data is decreased, and the processing of image data becomes easy.

It is a still further object of the invention to provide a method for amending color nonuniformity of color images in which even the difference and the fluctuation of colors not discriminated by human eyes are suppressed.

According to the invention, a method for amending color nonuniformity of color images, comprises:

calculating a brightness of each dot in accordance with three original color component data and brightness constants determined for three color components;

dividing dots into a plurality of groups in accordance with the brightness calculated in each dot; and equalizing the three original color component data of dots in each of the groups.

According to the invention, a method for amending color nonuniformity of color images is provided, wherein the strength of the brightness and the darkness to which an attention is paid to amend color nonuniformity of color images is amended, so that color smoothness of the color images is realized.

In general, red, green and blue are three original colors. Colors which can be usually sensed by human eyes are obtained by mixing these three colors in appropriate amounts. For instance, yellow is produced by the mixture of red and blue, and violet by red and blue. In case of light, red, green and blue are mixed to provide white. In this mixture, color tone can be different dependent on the brightness of the original colors, that is, reddish white or bluish white can be obtained by changing the brightness of the respective colors, although color can be changed in pigment by changing the amount of original colors. As described above, white is represented in light by mixing three original colors equally, and reddish white, for instance, pink is obtained by increasing the brightness of red. This invention is based on the strength of the brightness and the darkness to amend color nonuniformity.

BRIEF DESCRIPTION OF THE DRAWINGS

The invention will be explained in more detail in conjunction with appended drawings, wherein.

DESCRIPTION OF THE PREFERRED EMBODIMENT

Before explaining a method for amending color nonuniformity of color images of the preferred embodiment according to the invention, the relation between a color picture and image data obtained therefrom will be explained in FIG. 1.

Figure 1:
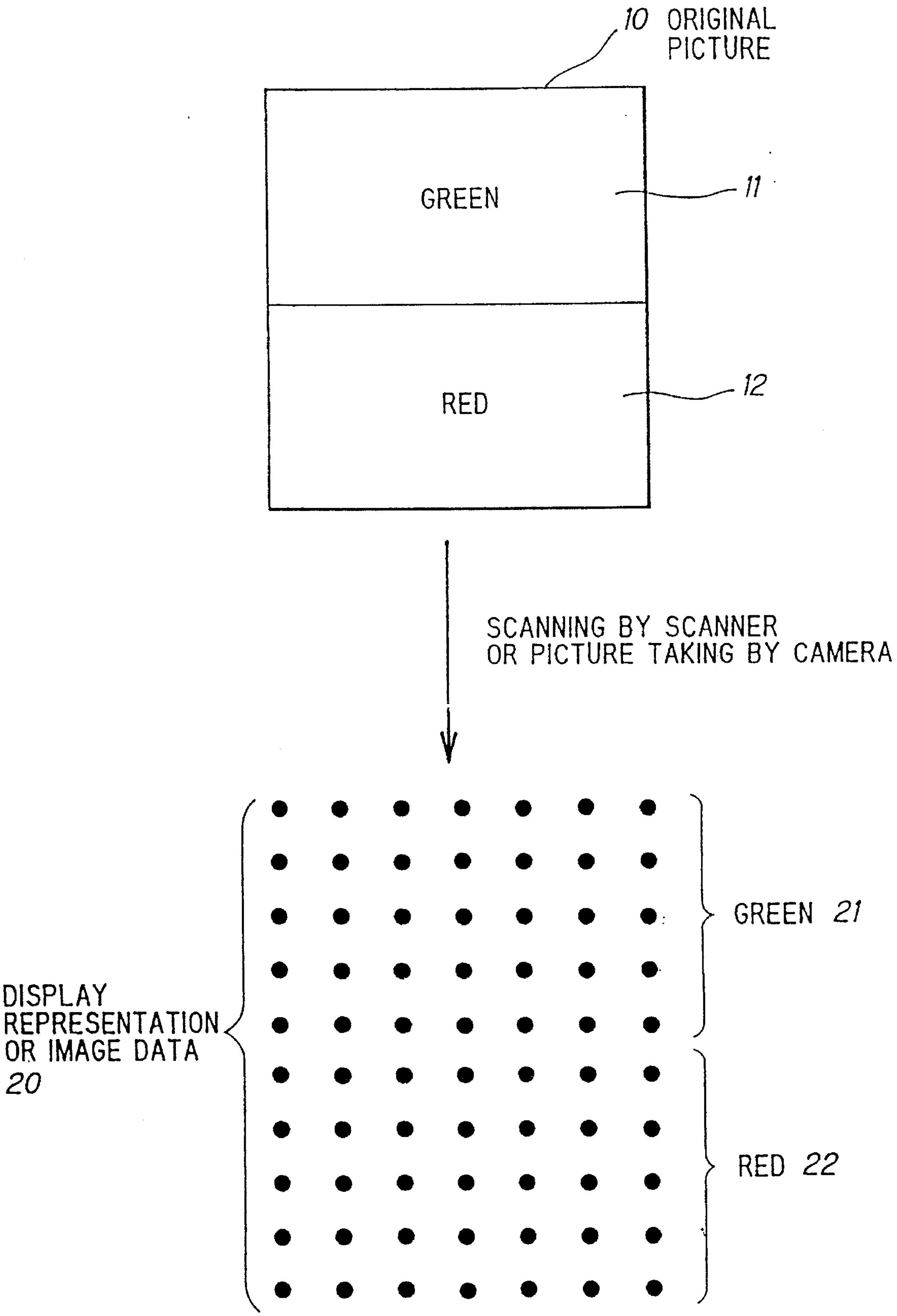
FIG. 1 is an explanatory view showing a form of storing image data obtained from a natural original picture.

FIG. 1 shows the color picture 10 including a green portion 11 and a red portion 12, and image data 20 including green data 21 and red data 22, respectively, composed of dots (pixels).

In a color display, each dot is displayed by three original colors each having information of light and shade. Such dots are obtained, for instance, as set out below.

First, an address of a virtual screen for display is designated, so that an address signal of, for instance, sixteen bits corresponding to the designated address of the virtual screen is generated in an address unit. The sixteen bit address signal is divided into a four bit color code and a twelve bit character code. The twelve bit character code is supplied to a memory called a character generator to generate a four bit address signal, each bit of which is supplied from a corresponding plane of four 8×8 bit planes read from the memory. Then, the four bit color code and the four bit address signal are combined to provide an eight bit address signal, by which a color table RAM called a color pallet is accessed.

Figure 2:
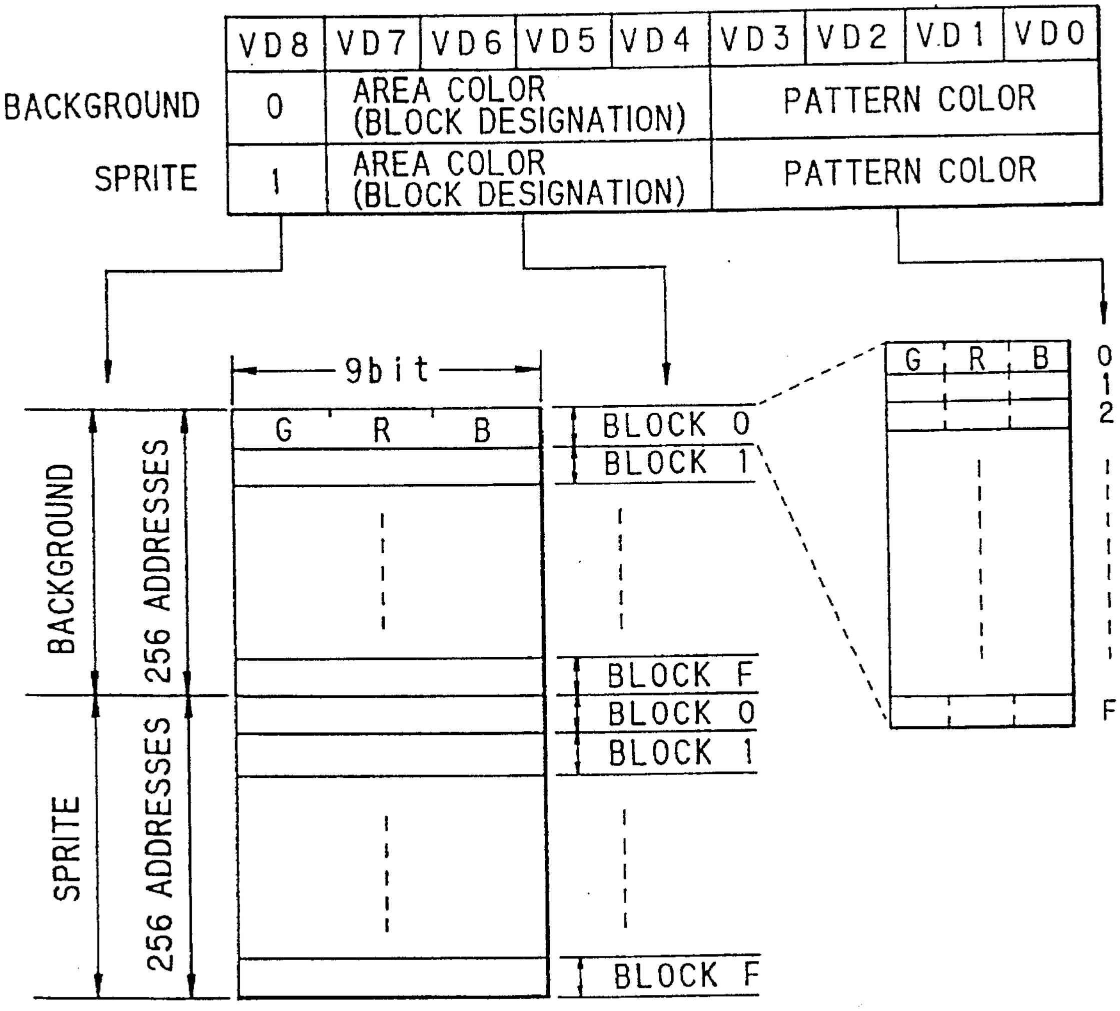
FIG. 2 is an explanatory view showing the relation between a color table RAM and color data stored therein.

FIG. 2 shows the eight bit address signal of VD0 to VD7, to which one bit of VD8 for designating one of background and sprite is added. The color table RAM stores nine bit color information at each address for one dot comprising each three bits for the original colors G, R and B, as illustrated therein. As understood from the illustration, the color table RAM comprises 16 blocks for background and 16 blocks the sprite. Each block is addressed by an area color code VD4 to VD7 of the address signal, and comprises 16 addresses each including nine bits of each three bits for G, R and B. Therefore, the color table RAM has a capacity of 256 addresses for background and 256 addresses for sprite, so that 256 kinds of colors can be represented on a display for each dot of background and sprite.

By selecting one color data from 256 color data in the color table RAM, the reproducibility of a natural picture can be maintained with a considerable precision. However, the difference of color, the color nonuniformity, the color fluctuation, etc. which can not be sensed by human eyes are not overcome completely.

In view of this disadvantage, the following steps are adopted in a method for amending color nonuniformity of color images.

(1) First step

A color is dissolved into three original colors. The components of green, red and blue are defined as "G", "R" and "B" which correspond to original data values at the time of scanning an original picture, for instance, by an image scanner. Further, a brightness ratio for green, red and blue determined by characteristics of a color display apparatus is defined as "a", "b" and "c". In accordance with the definitions, the degree P of the brightness and the darkness for each dot is defined by the equation (1).

$$P=(a\times G+b\times R+c\times B)/(a+b+C) \quad (1)$$

The degree P is a mean value of the brightness values for G, R and B. In the color processing by a computer, a calculation speed can be fast, when (a+b+c) is standardized to be "1".

$$\left.\begin{array}{l} a/(a+b+c) \longrightarrow a \\ b/(a+b+c) \longrightarrow b \\ c/(a+b+c) \longrightarrow c \end{array}\right\} \quad (2)$$

That is, if the substitutions as defined by the equations (2) are carried out in advance, the degree P is modified by the equation (3).

$$P=a\times G+b\times R+c\times B \quad (3)$$

In accordance with the above equation (3), the P value for each dot is calculated. Here, if it is assumed that a P value for the $i_{th}$ dot is "Pi", the equation (4) is obtained.

$$Pi=a\times Gi+b\times Ri+c\times Bi \quad (4)$$

In the equation (4), "Gi", "Ri" and "Bi" are color components of a color for the $i_{th}$ dot.

(2) Second step

In accordance with the P value calculated in the first step, a predetermined number of dots positioned around an arbitrary dot are grouped, such that the grouped dots have P values which fall in "$P_N \pm \Delta P_N$", when the arbitrary dot has a P value of "$P_N$". Here, it is assumed that the number of the grouped dots is "n", and mean values "Gm", "Rm" and "Bm" of three original color components of the grouped dots are calculated by the equations (5).

$$\left.\begin{array}{l} Gm=(G_1+G_2+\ldots+Gn)/n \\ Rm=(R_1+R_2+\ldots+Rn)/n \\ Bm=(B_1+B_2+\ldots+Bn)/n \end{array}\right\} \quad (5)$$

(3) Third step

In the grouped dots, each color component value is substituted by a corresponding one of the means values Gm, Rm and Bm as set out below.

$$G_1, G_2, \ldots Gn \rightarrow Gm$$

$$R_1, R_2, \ldots Rn \rightarrow Rm$$

$$B_1, B_2, \ldots Bn \rightarrow Bm$$

In accordance with the above described processing, the fluctuation of color data is smoothed. If the value $\Delta P_N$ as discussed at the second step is less than a color discrimination power of human eyes, the fluctuation of color data is resolved without deteriorating the reproducibility of an original image. As understood from the above, color data of the grouped dots become the same for each color components, so that the number of color data is decreased. That is, the color data can be stored in a memory in the form of "(the number of the grouped dots)×(a mean value of color data)".

This is a compression of color data to decrease a capacity of a memory and increase a speed of data transfer.

Next, a method for amending color nonuniformity of color images of a preferred embodiment according to the invention will be explained in FIGS. 3A to 3C.

Figure 3A:
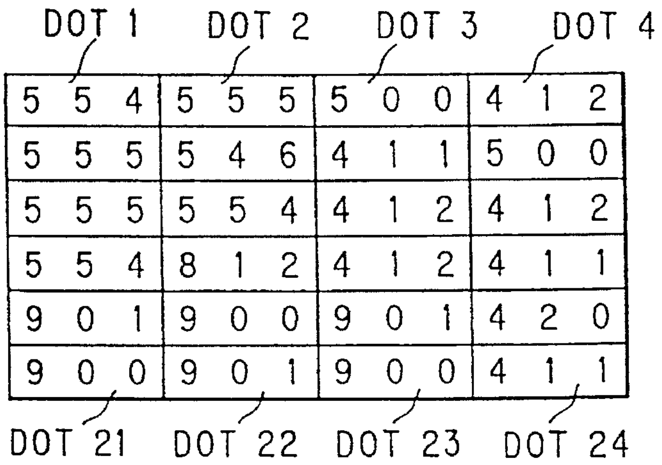
FIGS. 3*a–c* are explanatory views showing color data for smoothing the color fluctuation of data obtained from a natural picture by an image input apparatus in a preferred embodiment according to the invention.

In FIG. 3A, color data for 24 dots 1, 2, 3, 4, . . . , 24 are shown, wherein each color data includes three component values corresponding to green (G), red (R) and blue (B). For instance, the color data for the first dot 1 include green, red and blue color component values of "5", "5" and "4".

Here, it is assumed that the aforementioned values of "a", "b" and "c" are "0.6", "0.3" and "0.1", respectively. Then, the aforementioned P values which are calculated for the first to fourth dots 1, 2, 3 and 4 by using the equation (4) are set out below.

$$P_1=5\times0.6+5\times0.3+4\times0.1=4.9$$

$$P_2=5\times0.6+5\times0.3+5\times0.1=5.0$$

$$P_3=5\times0.6+0\times0.3+0\times0.1=3.0$$

$$P_4=4\times0.6+1\times0.3+2\times0.1=2.9$$

Figure 3B:
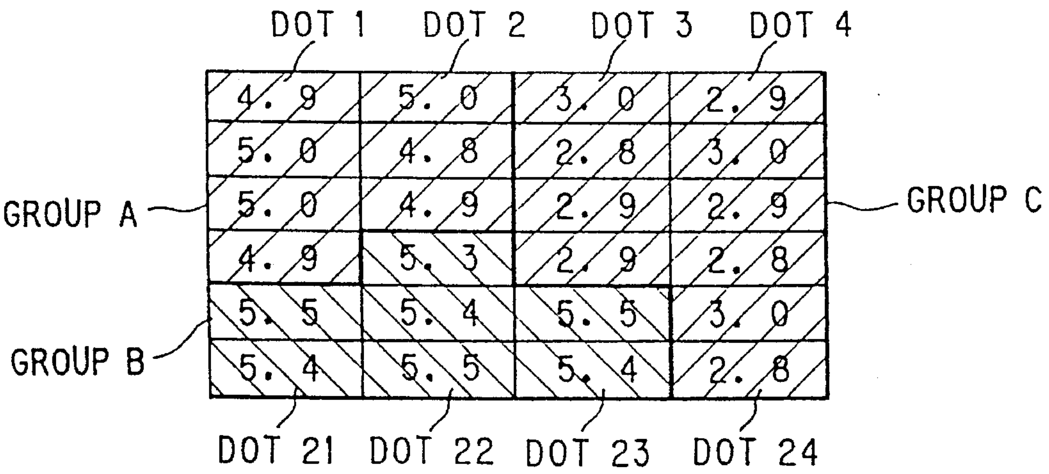

In the same manner, the P values for the remaining dots 5, 6, . . . , 24 are calculated, and the results are shown in FIG. 3B.

Then, the grouping of the dots is carried out. Here, it is assumed that the aforementioned value $\Delta P_N$ is 0.1. In accordance with this assumption, the following ranges are obtained by using three selected values "4.9", "5.4" and "2.9" for the aforementioned value "$P_N$".

4.9±0.1=4.8~5.0

5.4±0.1=5.3~5.5

2.9±0.1=2.8~3.0

Thus, three groups A, B and C are defined as shown in FIG. 3B by using the three ranges "4.8~5.0", "5.3~5.5" and "2.8~3.0".

The first group A has 7 dots, the second group B has 7 dots, and the third group C has 10 dots.

In the three groups A, B and C, the aforementioned mean values Gm, Rm and Bm are calculated by using the equations (5).

In the group A,

Gm=(5+5+5+5+5+5+5)/7=5

Rm=(5+5+5+5+5+4+5)/7=4.85

Bm=(4+5+5+4+5+6+4)/7=4.71

In the group B,

Gm=(9+9+8+9+9+9+9)/7=8.85

Rm=(0+0+1+0+0+0+0)/7=0.14

Bm=(1+0+2+0+1+1+0)/7=0.71

In the group C,

Gm=(5+4+4+4+4+5+4+4+4+4)/10=4.2

Rm=(0+1+1+1+1+0+1+1+2+1)/10=0.9

Bm=(0+1+2+2+2+0+2+1+0+1)/10=1.1

In each group, the calculated values are counted by fraction of 0.5 and over as a unit, and cut away by the rest thereof, so that the following color data are obtained. "(5,5,5) for the group A, (9,0,1) for the group B, and (4,1,1) for the group C."

Figure 3C:
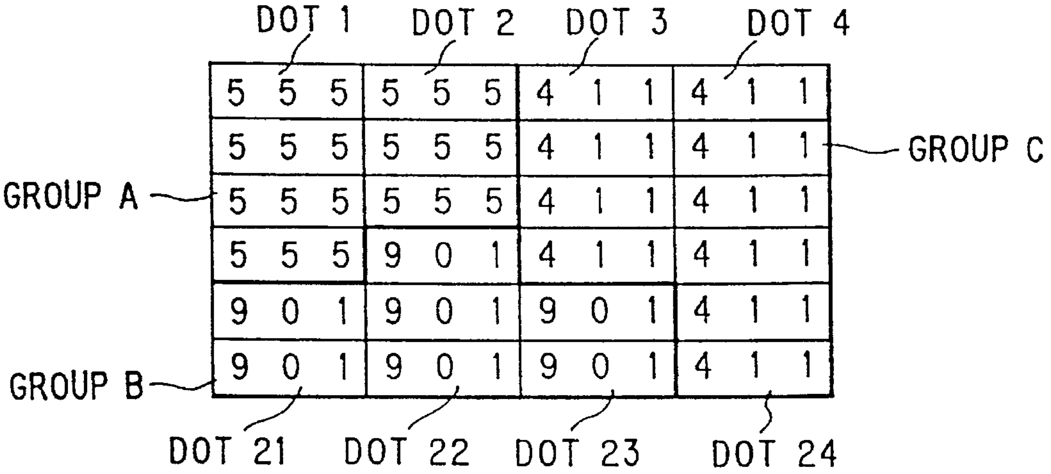

In accordance with the grouped color data, the color data as shown in FIG. 3*b* is substituted as shown in FIG. 3C.

Figure 4:
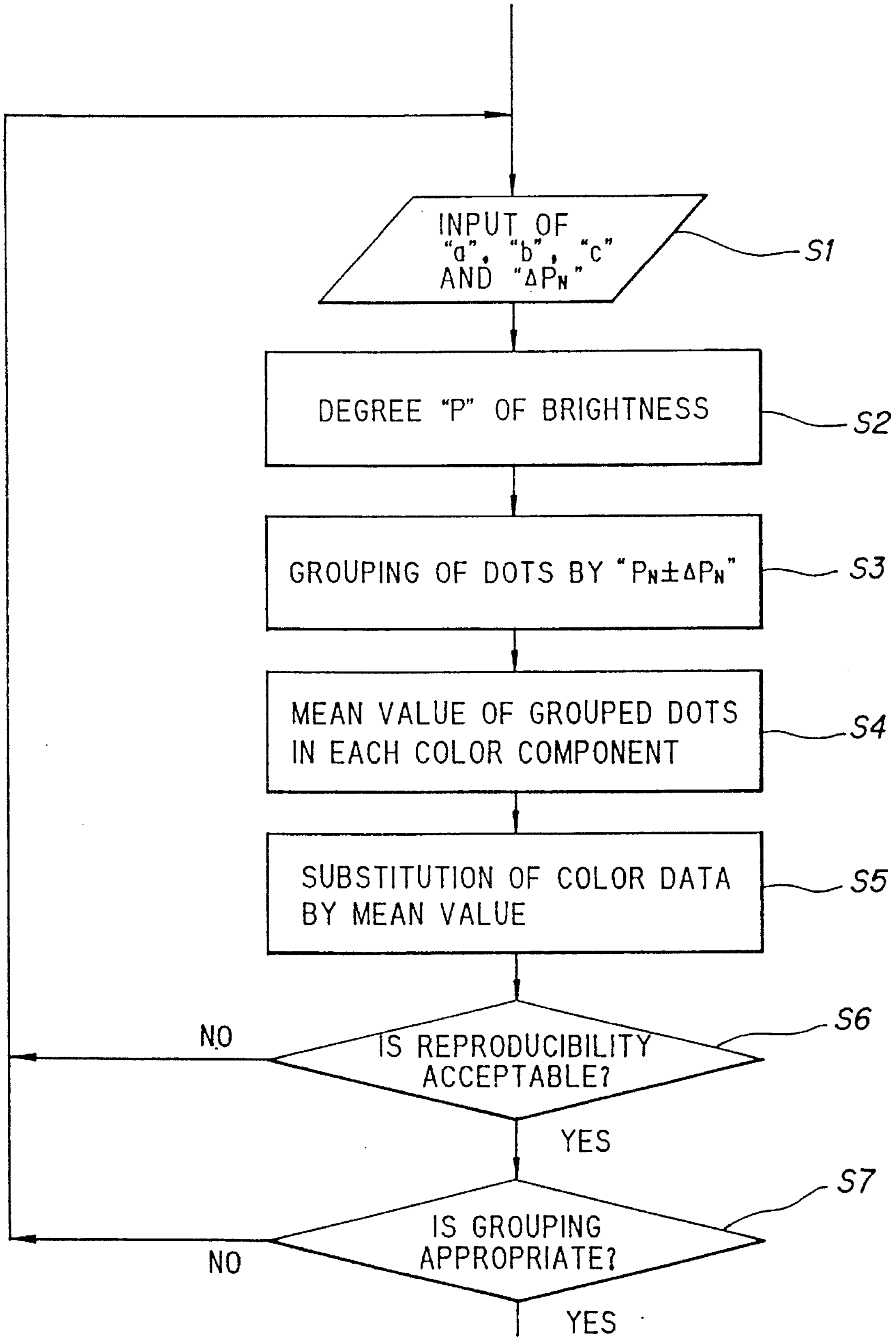
FIG. 4 is a flow chart of a procedure for smoothing the color fluctuation in the preferred embodiment.

The steps of smoothing color components of original data as described above are explained in a flow chart as shown in FIG. 4.

In this flow chart, the ratio values "a", "b" and "c" of the strength of the brightness and the darkness in the color components and the range value "$\Delta P_N$" of grouping the dots are input to a computer. These input values depend on characteristics of a display apparatus and a computer, and are determined to be optimum for a hardware used in a method for amending color nonuniformity of color images according to the invention. After the determination of these input values by the trial and error method, they may be fixed in the hardware.

The steps S1 to S5 are explained in the above preferred embodiment. At the step S6, the reproducibility of color images are checked to meet a predetermined quality by comparing an original picture and an image represented on a screen of a display apparatus. When the reproducibility is met and the grouped number is equal to be or less than a predetermined number, the processing of amending color nonuniformity of color images is determined to be successful and allowable. As the range value "$\Delta P_N$" for grouping dots is increased, the number of groups is decreased to lower the reproducibility. Considering this relation, the range value "$\Delta P_N$" is required to be decided in the invention.

Figure 5:
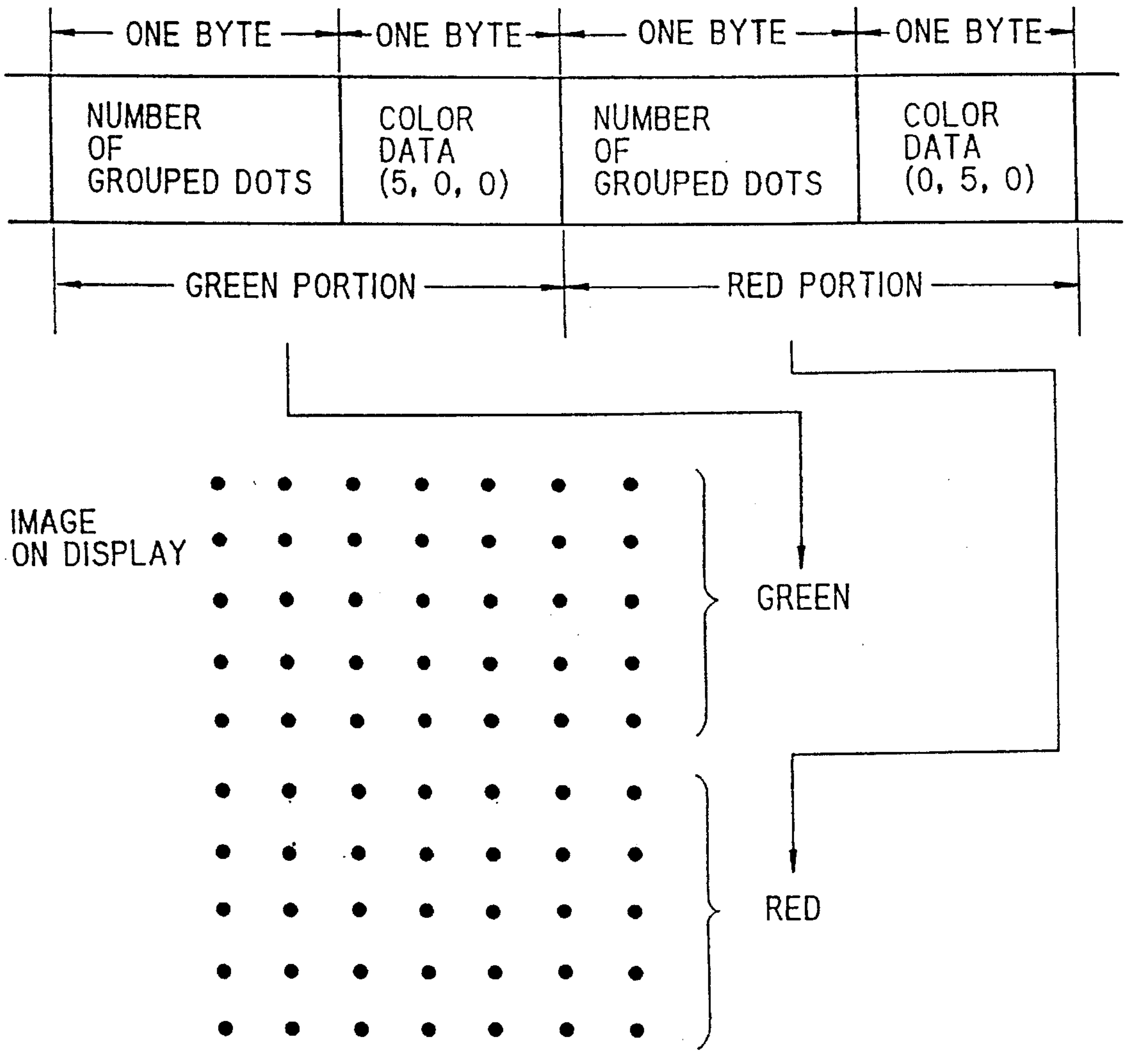
FIG. 5 is an explanatory view showing data compression in the preferred embodiment.

With reference again to FIG. 1, an original picture of green and red is shown therein. When the original picture is observed by human eyes, color data (5,0,0) for the green portion and color data (0,5,0) for the red portion are sensed. As a matter of course, (5,0,0) means that a green component is 5, and red and blue components are 0, while (0,5,0) means that a red component is 5, and green and blue components are 0. On the other hand, when the original picture is scanned by a scanner, or taken or viewed by an image input apparatus such as a video camera, such color data as (5,1,0), (5,0,1), (0,5,2), (0,6,0), etc. are produced to be added to the color data (5,0,0), and (0,5,0) for instance, due to stain on the original picture, the precision of the scanner or the image input apparatus, etc. In a conventional manner, the increase of color data necessitates an additional capacity of a memory. In the invention, however, the color data of (5,1,0), (5,0,1), (0,5,2), (0,6,0), etc. are processed to be grouped into (5,0,0) and (0,5,0). Thus, a memory capacity increase is avoided. This is shown in FIG. 5. As clearly understood from the illustration, the color data for the original picture of FIG. 1 are stored in a memory by using only four bytes, and a color image is represented on a screen of a display apparatus as shown in FIG. 5.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A method for amending color nonuniformity of color images, comprising the steps of:

dissolving a color of a pixel into data relating to three original colors;

calculating a degree of strengths of brightness and darkness values of each dot in accordance with each of the three original color component data and comparing the degree of brightness with predetermined brightness quality constants determined for three color components;

dividing said dots into a plurality of groups in accordance with said degree of said strengths of brightness calculated for each dot; and equalizing said three original color component data of dots in each of said groups based upon said calculated degree of strengths of brightness and darkness values of each of said three original colors.

2. A method for amending color nonuniformity of color images, according to claim 1, wherein said calculating step, comprises the steps of:

determining brightness constants "a", "b" and "c" for said three original color components, said brightness constants being introduced by hardware used to display said color images; and calculating "P=axG+bxR+cxB" which is said brightness of said each dot, where "G", "R" and "B" represent green, red, and blue, respectively, which are said three original color component data.

3. A method for amending color nonuniformity of color images, according to claim 1, wherein said dividing step, comprises the steps of:

setting reference ranges for said groups; and comparing said brightness of said each dot with a corresponding one of said reference ranges, said each dot being grouped dependent on as to in which one of said reference ranges said brightness of said each dot resides.

4. A method for amending color nonuniformity of color images, according to claim 1, wherein said equalizing step, comprises the steps of:

calculating mean values of said three original color component data of said dots in each of said groups; and substituting said three original color component data of said dots in each of said groups by said mean values.

5. A method for amending a nonuniformity in the color of color images, said method comprising the steps of:

(a) fixing brightness ratios "a", "b" and "c" for green, red and blue components, respectively, as determined by characteristics of a color display apparatus;

(b) fixing a range value "ΔP" for determining a width of a degree "P" of brightness and darkness for pixels while grouping said pixels in regard to brightness and darkness;

(c) calculating said degree "P" of brightness and darkness in accordance with a summation equation "P=a·G+b·R+c·B", where "G", "R" and "B" are color components for green, red and blue;

(d) grouping said pixels in regard to brightness and darkness in accordance with a term "P±ΔP";

(e) calculating mean values "Gm", "Rm" and "Bm" in each group which is grouped in step (d) in accordance with equations "$Gm=(G_1+G_2+ - - - +G_n)/n$", "$Rm=(R_1+R_2+ - - - +R_n)/n$" and "$Bm=(B_1+B_2+ - - - +B_n)/n$", where "n" is a number of pixels in a group, "$G_1$", "$G_2$" - - - "Gn", "$R_1$", "$R_2$" - - - "Rn" and "$B_1$", "$B_2$" - - - "Bn" are color components for green, red and blue, respectively, of said pixels in said group; and (f) equalizing the color component values by replacing data of said color components with said calculated mean values in said each of said groups.

6. The method of claim 5 and the added steps of:

comparing an original image with an image represented on a screen of said display apparatus; and accepting said color image in joint response to (i) said comparison of said original image and said image displayed on said screen, and (ii) said number of pixels in said grouping of step (d) being less than a predetermined number.

* * * * *